(12) United States Patent
Park

(10) Patent No.: US 9,865,506 B2
(45) Date of Patent: Jan. 9, 2018

(54) STACK TYPE SEMICONDUCTOR MEMORY DEVICE

(71) Applicant: SK hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/006,782

(22) Filed: Jan. 26, 2016

(65) Prior Publication Data
US 2016/0155779 A1    Jun. 2, 2016

Related U.S. Application Data

(63) Continuation-in-part of application No. 13/489,878, filed on Jun. 6, 2012, now Pat. No. 9,245,588.

(30) Foreign Application Priority Data

Dec. 15, 2011  (KR) .................. 10-2011-0135698

(51) Int. Cl.
| | | |
|---|---|---|
| H01L 21/8234 | (2006.01) | |
| H01L 27/24 | (2006.01) | |
| H01L 27/22 | (2006.01) | |
| H01L 29/423 | (2006.01) | |
| G11C 5/02 | (2006.01) | |
| G11C 11/16 | (2006.01) | |
| G11C 13/00 | (2006.01) | |
| H01L 45/00 | (2006.01) | |

(52) U.S. Cl.
CPC ........ *H01L 21/823437* (2013.01); *G11C 5/02* (2013.01); *G11C 11/16* (2013.01); *G11C 11/1659* (2013.01); *G11C 13/0002* (2013.01); *G11C 13/003* (2013.01); *G11C 13/0004* (2013.01); *G11C 13/0016* (2013.01); *H01L 21/823418* (2013.01); *H01L 27/228* (2013.01); *H01L 27/249* (2013.01); *H01L 27/2436* (2013.01); *H01L 29/42376* (2013.01); *G11C 2213/71* (2013.01); *G11C 2213/79* (2013.01); *G11C 2213/82* (2013.01); *H01L 45/04* (2013.01); *H01L 45/06* (2013.01); *H01L 45/1226* (2013.01); *H01L 45/147* (2013.01)

(58) Field of Classification Search
CPC ....... H01L 2924/00; H01L 2924/00014; H01L 2224/94; H01L 2224/83; H01L 2221/68327
See application file for complete search history.

(56) References Cited

U.S. PATENT DOCUMENTS

| | | | | |
|---|---|---|---|---|
| 2008/0149992 | A1* | 6/2008 | Gidon | H01L 27/11521 257/316 |
| 2010/0244119 | A1 | 9/2010 | Fukuzumi et al. | |
| 2010/0327323 | A1* | 12/2010 | Choi | G11C 16/0483 257/202 |

FOREIGN PATENT DOCUMENTS

| | | |
|---|---|---|
| CN | 1462478 | 12/2003 |
| CN | 102237368 | 11/2011 |

* cited by examiner

*Primary Examiner* — Tony Tran
(74) *Attorney, Agent, or Firm* — IP & T Group LLP

(57) ABSTRACT

A stack type memory device and a method of manufacturing the same are provided. The stack type memory device includes a semiconductor substrate, a plurality of active layers stacked on the semiconductor substrate, and a gate structure overlapping the plurality of active layers. The gate structure includes a side gate region overlapping sides of the plurality of active layers and a top gate region overlapping a top of an uppermost active layer.

5 Claims, 14 Drawing Sheets

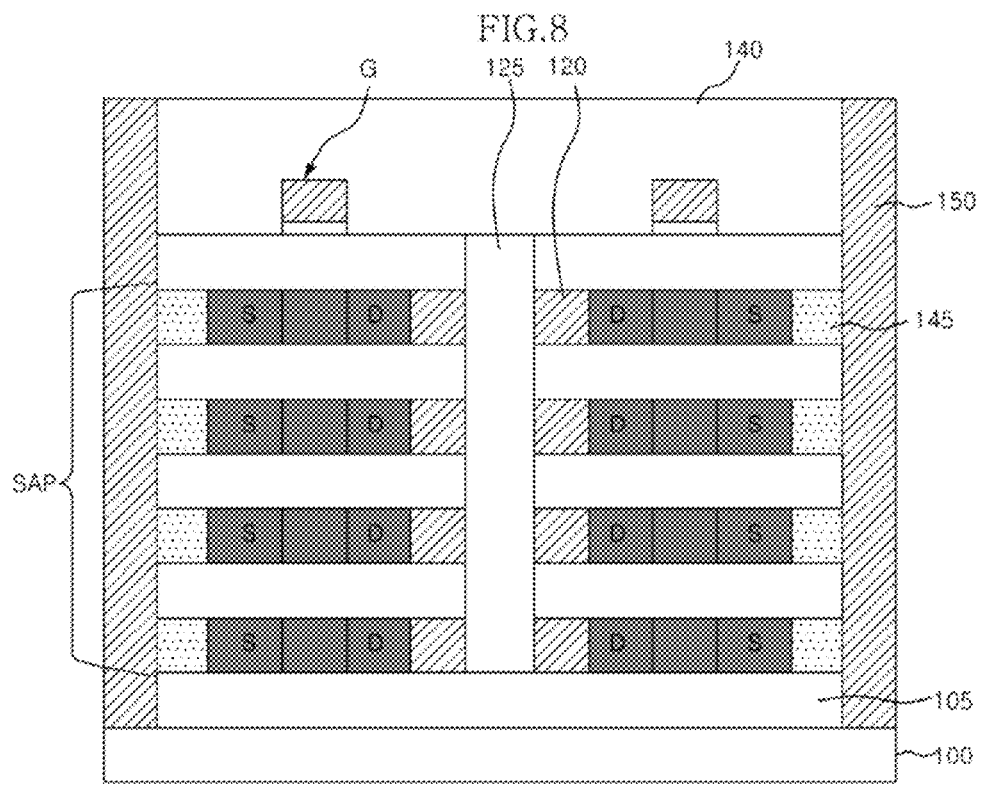
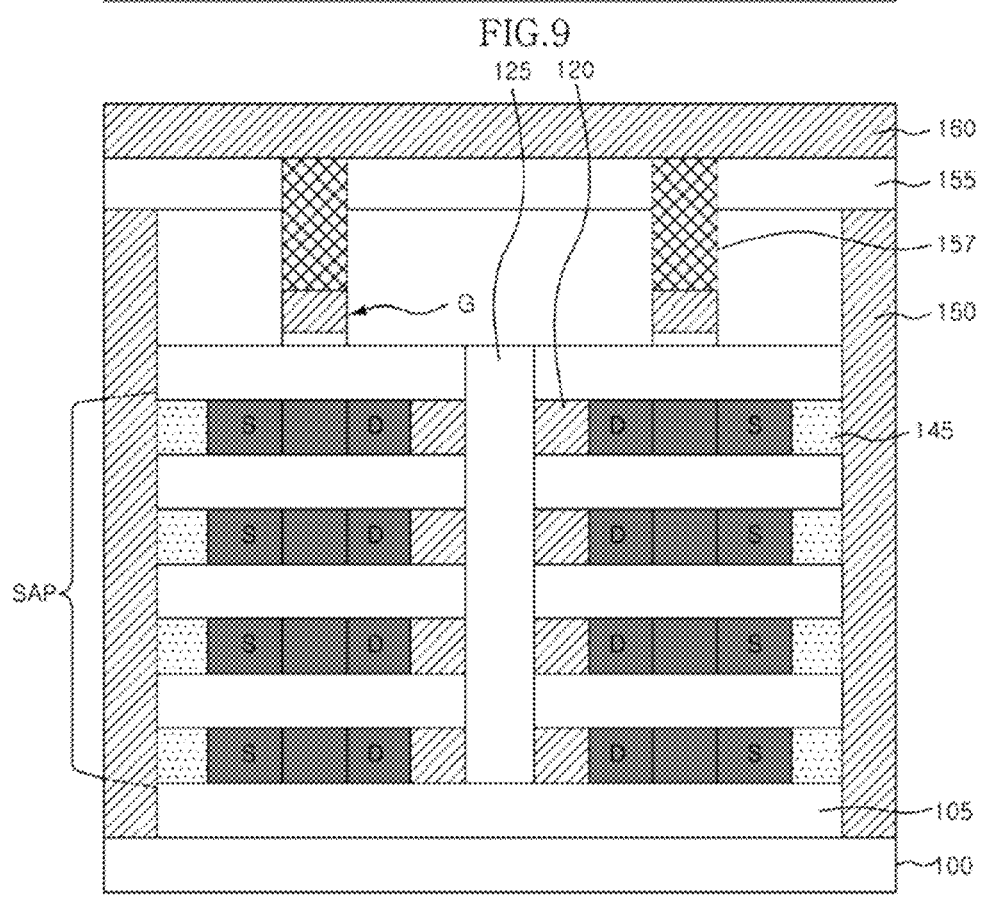

STACK TYPE SEMICONDUCTOR MEMORY DEVICE

CROSS-REFERENCES TO RELATED APPLICATION

This application is a continuation-in-part of the U.S. patent application Ser. No. 13/489,878 filed on Jun. 6, 2012 and titled "STACK TYPE SEMICONDUCTOR MEMORY DEVICE", which claims priority under 35 U.S.C. 119(a) to Korean application number 10-2011-0135698, filed on Dec. 15, 2011, in the Korean Patent Office. The disclosure of each of the foregoing applications is incorporated herein by reference in its entirety.

BACKGROUND OF THE INVENTION

1. Technical Field

The present invention relates to semiconductor integration circuit technology, and more particularly, to a stack type memory device having a three dimensional stack cell.

2. Related Art

With development in a mobile and digital information communication industry and an appliance industry, existing electron charge control-based devices are reaching their physical limits. Thus, new functional memory devices of a new configuration have developed. In particular, the development of next-generation memory devices with large capacity, ultra high-speed, and ultra lower-power consumption may include the features for large capacity of a memory in main information appliances.

Currently, resistive memory devices, which use a resistive device as a memory medium, have been suggested as the next-generation memory devices. These next-generation memory devices may include phase-change memory devices, resistive memory devices, and magnetoresistive memory devices.

The resistive memory device may include a switching device and a resistive device, and the resistive memory device stores data "0" or "1" according to a state of the resistive device.

In addition, the resistive memory devices may improve an integration density and increasing the capacity in a limited area is important.

In addition the phase-change memory device uses a diode coupled to a word line as a switching device and forms a word line to have a linewidth as narrow as possible to reduce an integration density. Thus, a resistance of the word line is increased to cause word line bouncing, and a word line voltage may be unstable.

SUMMARY

According to one aspect of an exemplary embodiment a stack type memory device includes a semiconductor substrate a plurality of active layers stacked on the semiconductor substrate; and a gate structure overlapping the plurality of active layers. The gate structure may include a side gate region overlapping sides of the plurality of active layers and a top gate region overlapping a top of an uppermost active layer.

According to another aspect of an exemplary embodiment, a method of manufacturing a stack type memory device, the method includes alternately stacking an insulating layer and a semiconductor layer on a semiconductor substrate several times; defining a stacked active structure by patterning the insulating layer and the semiconductor layer; forming a first hole through a removing process which pulls back one-end portion of the semiconductor layer of the stacked active structure; forming a bit line in the first hole; forming a second hole through a removing process which pulls back the other-end portion of the semiconductor layer of the stacked active structure; forming a variable resistive layer in the second hole; forming a gate insulating layer on a surface of the stacked active structure; forming a gate conductive layer on a surface of the gate insulating layer; forming a gate structure by patterning the gate conductive layer and the gate insulating layer; and forming a source and a drain by implanting impurities into exposed portions of the semiconductor layer at both sides of the gate structure.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIGS. 2 to 9 are cross-sectional views for processes illustrating a method of manufacturing a stack type memory device according to an exemplary embodiment of the present invention;

DESCRIPTION OF EXEMPLARY EMBODIMENT

Figure 1A:
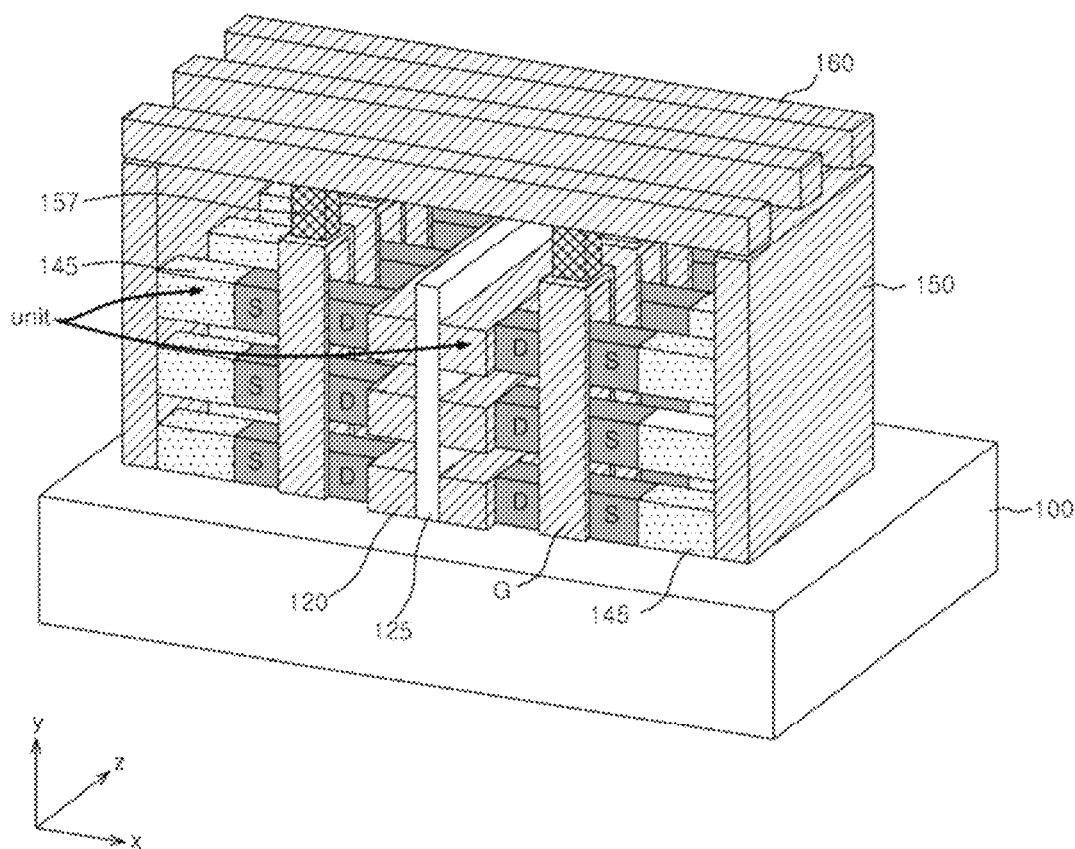
FIG. 1A is a perspective view illustrating a stack type memory device according to an exemplary embodiment of the present invention.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being 'on' another layer or substrate, it can be directly on the other or substrate, or intervening layers may also be present.

Figure 1B:
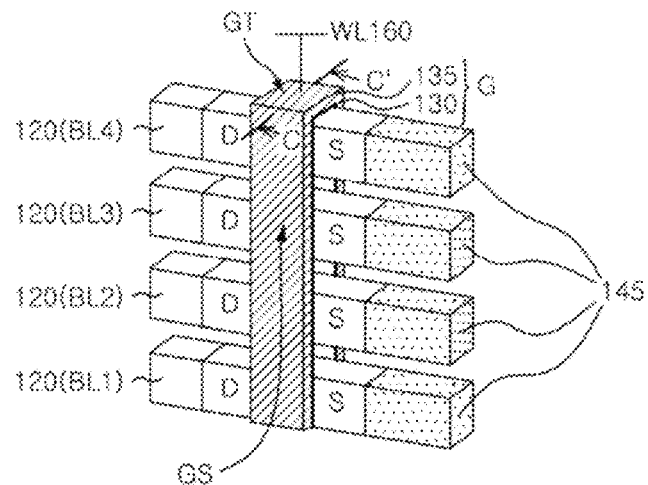
FIG. 1B is a cross-sectional view illustrating a unit active region of a stack type memory device according to an exemplary embodiment of the preset invention.
Figure 1C:
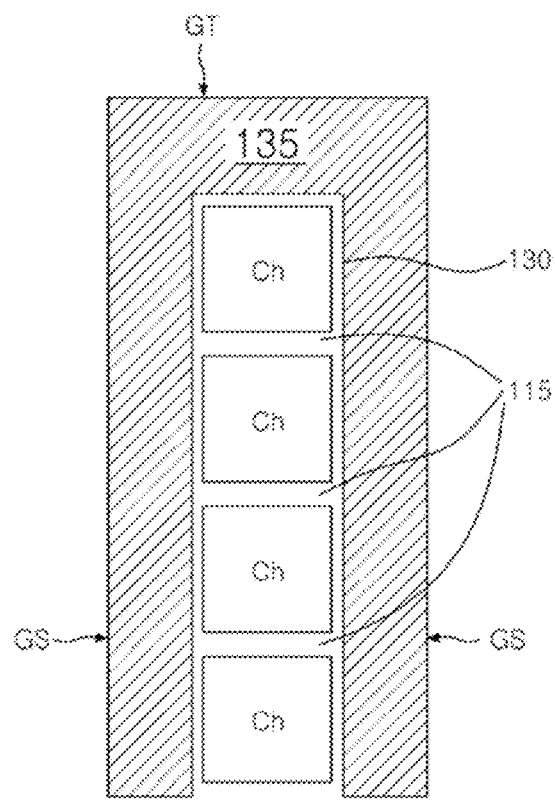
FIG. 1C is a cross-sectional view taken along line C-C' of FIG. 1B.

FIG. 1A is a perspective view illustrating a stack type memory device according to an exemplary embodiment of the present invention. FIG. 1B is a cross-sectional view illustrating a unit active region unit of a stack type memory device according to an exemplary embodiment of the preset invention. FIG. 1C is a cross-sectional view take along line C-C' of FIG. 1B.

Referring to FIGS. 1A to 1C, a plurality of active layers 110 having stripe shapes are stacked on a semiconductor substrate 100, and insulating layers 115 are interposed between the plurality of active layers 110. The stacked active layers 110 are divided into unit active regions unit by insulating plugs 125 extending in the z direction.

A gate structure G is formed to surround central portions of the stacked unit active regions unit. The gate structure G may include a gate electrode 135 and a gate insulating layer 130 formed between the gate electrode 135 and the active layers 110. The gate structure G may be formed in an inverse "U"-shape to surround a top of the uppermost unit active region of the stacked unit active regions unit and sidewalls of the stacked unit active regions unit. The gate structure G is electrically coupled to a word line (WL) 160. The gate structure G may include a top gate region GT formed on the uppermost unit active region unit and a side gate region GS formed the sidewalls of the stacked unit active regions. The top gate region GT and the side gate region GS may be electrically coupled.

A source S and a drain D are formed in each of the plurality of active layers on the basis of the side gate region GS so that a transistor is formed in each unit active region unit. A channel region ch of the transistor may be formed in the unit active region unit facing the side is gate region GS.

Bit lines (BL1, BL2, BL3, and BL4) 120 may be formed in one sides of the stacked drains D and resistive device layers 145 may be formed in one sides of the stacked sources.

At this time, the bit line 120 may be commonly coupled to drains D that are arranged to overlap the bit line 120 in the z-direction of FIG. 1A in a same layer (on a same plane). The bit lines extend in a direction that crosses the word line 160.

In addition, the resistive device layer 145 is a storage medium configured to store a signal of the bit line 120 according to a switching operation of a transistor. The resistive device layer 145 may include any one selected from the group consisting of a praseodymium calcium manganese oxide (PCMC) layer, which is a material for a resistive random access memory (ReRAM), a chalcogenide layer, which is a material for a phase-change random access memory (PCRAM), a magnetic layer, which is a material for a magnetic random access memory (MRAM), a magnetization switching device layer, which is a material for a spin-transfer torque MRAM (STTMRAM), and a polymer layer, which is a material for a polymer random access memory (PoRAM).

The resistive device layers 145 may be coupled to a common source line 150 in common, and for example, the common source line 150 may be a terminal for a ground voltage.

The stack type memory device is capable of integrating a plurality of memory cells in a limited area by a stacked arrangement of the active regions and bit lines.

FIGS. 2 to 9 are cross-sectional views for processes illustrating a method of manufacturing the stack type memory device of FIG. 1. FIGS. 10 to 17 are plan views for processes illustrating a method of manufacturing the stack type memory device of FIG. 1. Here, FIGS. 10 to 17 are plan views in an x-z plane. FIGS. 2 to 9 are cross-sectional views taken along line a-a' of FIGS. 10 to 17.

Figure 2:
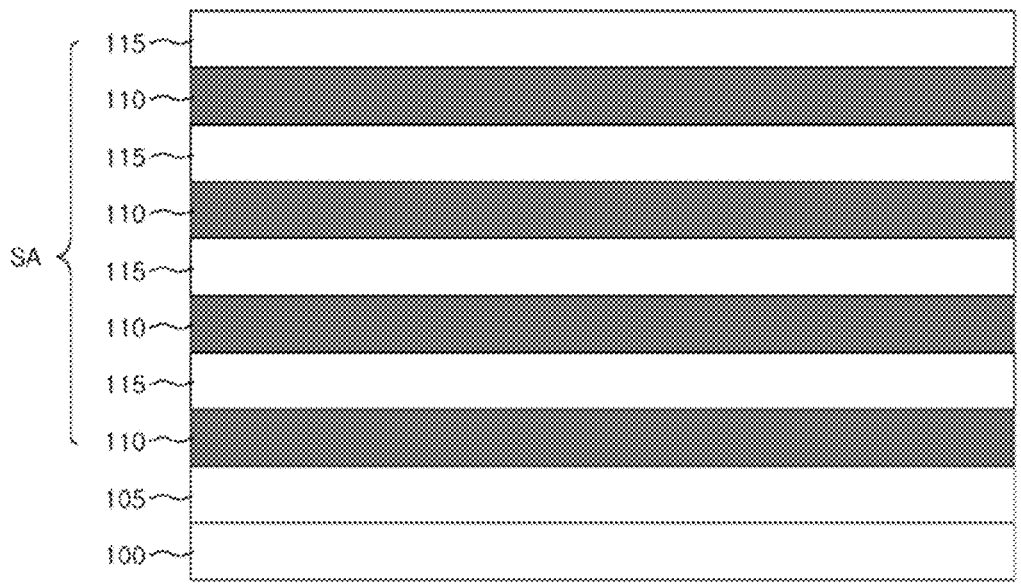
Figure 10:
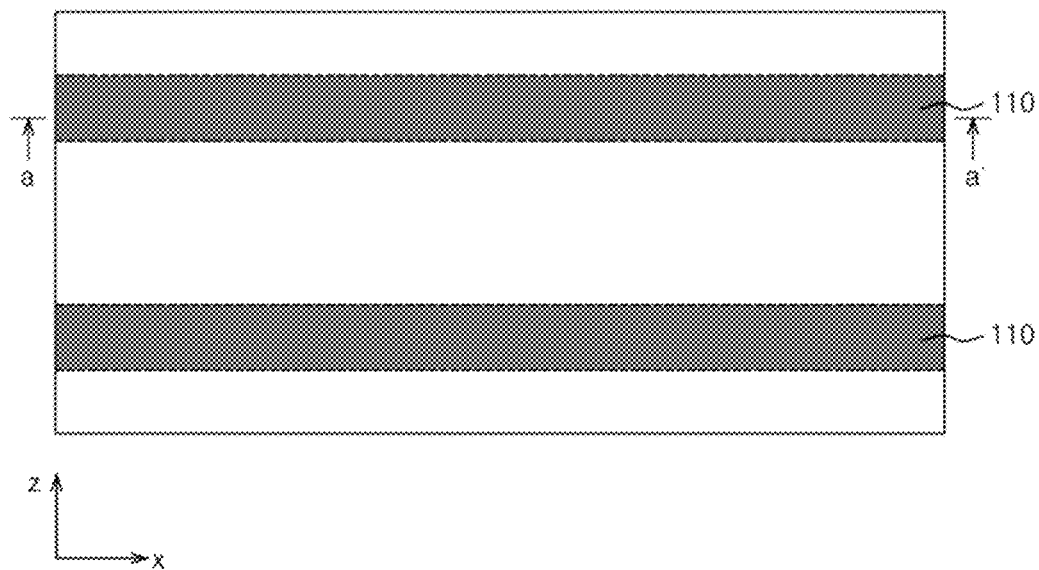
FIGS. 10 and 17 are plan views for processes illustrating a method of manufacturing a stack type memory device according to an exemplary embodiment of the present invention.

Referring to FIGS. 2 and 10, an insulating layer 105 is formed on a semiconductor substrate 100. An active layer 110 and an interlayer insulating layer 115 are formed repeatedly so that a plurality of active layers 110 and a plurality of interlayer insulating layers 115 are alternately stacked, thereby forming a stacked active structure SA. The active layer 110 may include a semiconductor layer such as silicon (Si), a silicon germanium (SiGe), and gallium arsenide (GaAs), and the active layer 110 may be constituted of a single layer or multiple layers selected from the Si, SiGe, and GaAs. For example, the insulating layer 105 and the interlayer insulating layer 115 may include a silicon oxide material.

Figure 3:
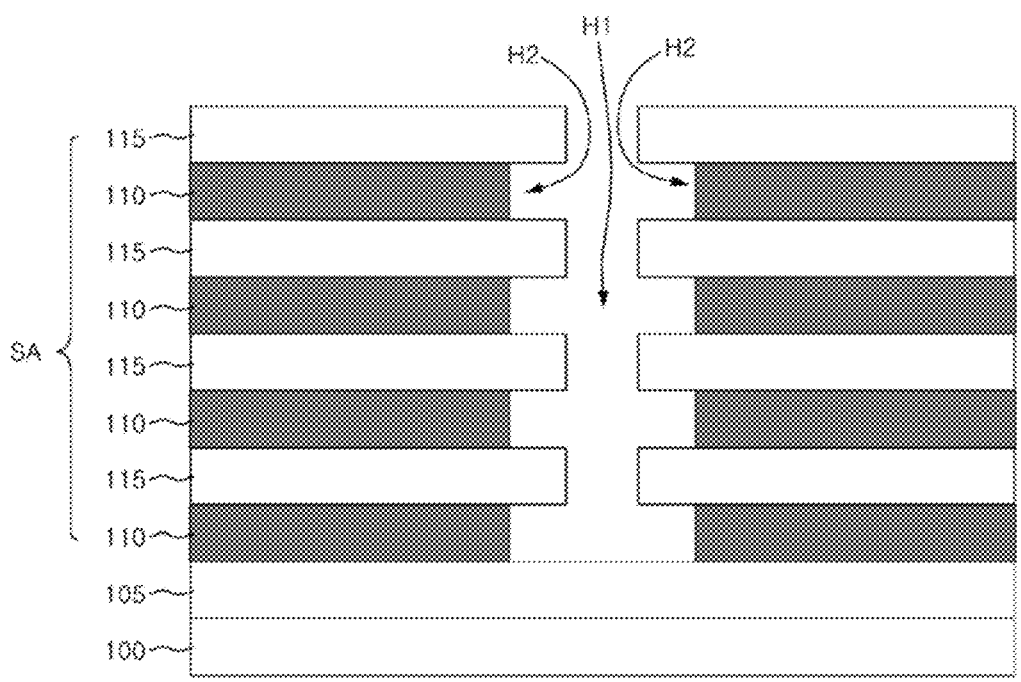
Figure 11:
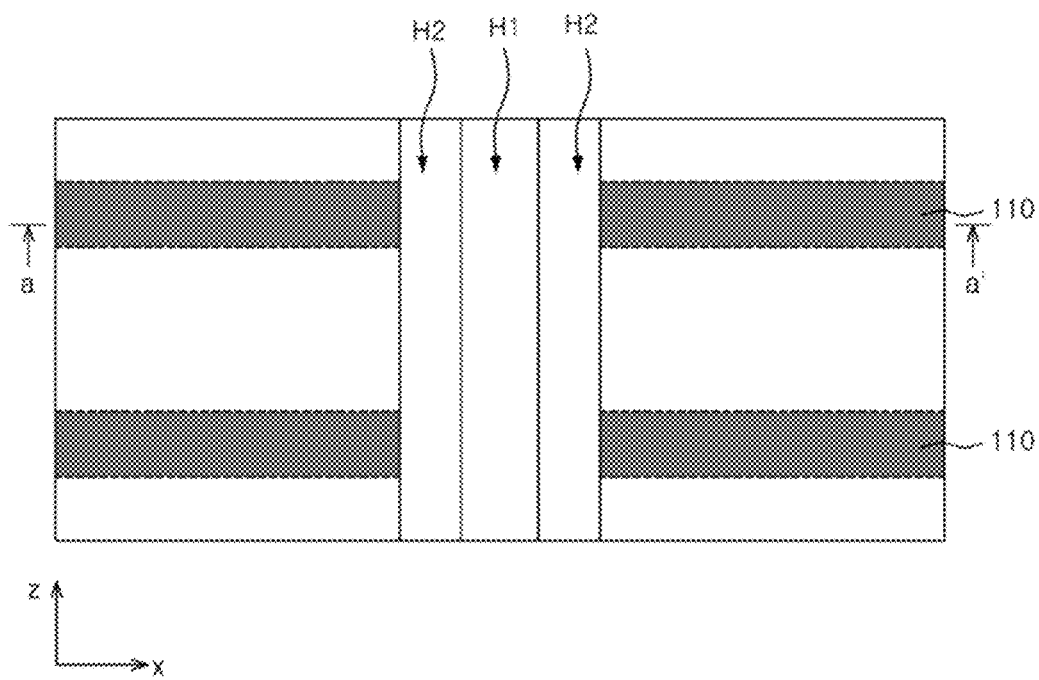

Referring to FIGS. 3 and 11, a first portion of the stacked active structure SA is patterned to expose the insulating layer 105. This patterning process forms a first hole H1. Subsequently second holes H2 are formed through an etching process that pulls back the active layers 110 exposed through the first hole H1 from a lateral surface of the interlayer insulating layer 115. The first hole H1 is a hole for separating a bit line, and the second holes H2 are regions that define bit line regions. At this time, the stacked active structure SA is separated left and right along the z-direction by the first and second holes H1 and H2.

Figure 4:
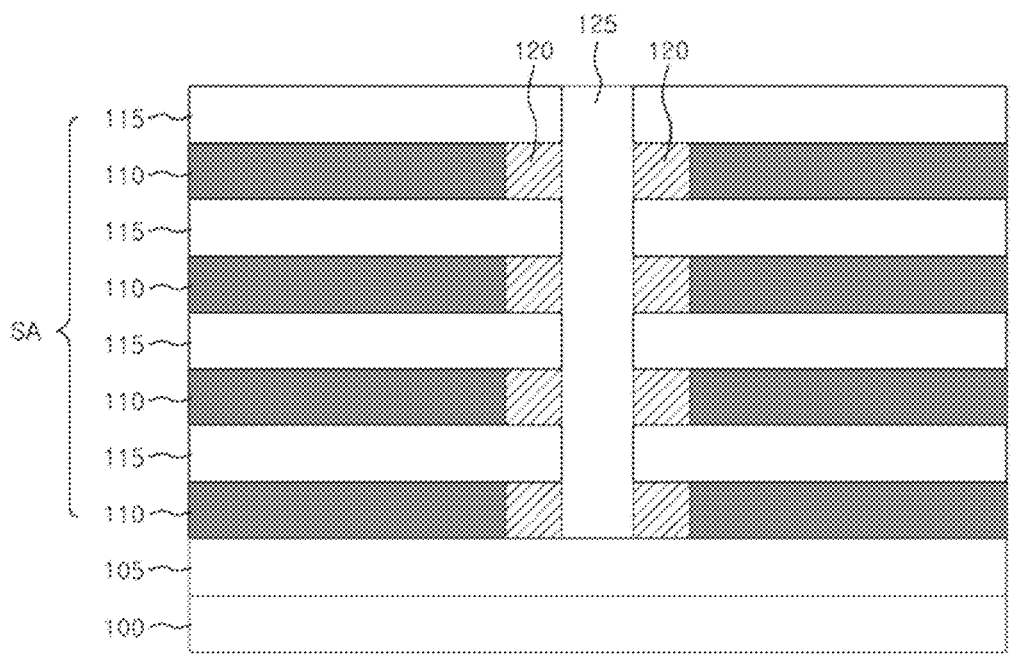
Figure 12:
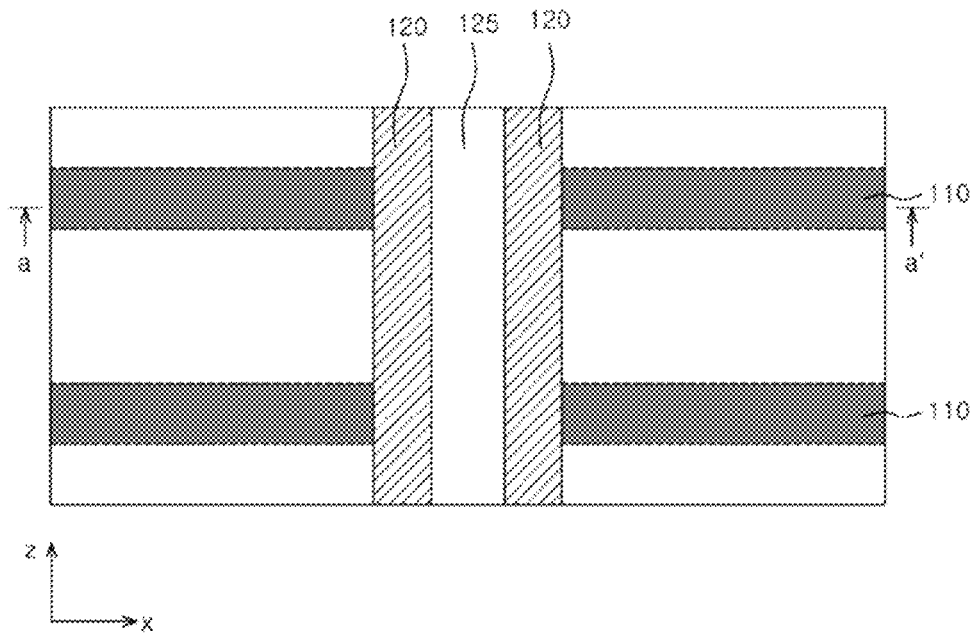

Referring to FIGS. 4 and 12, a conductive material fills the second holes H2 to form bit lines 120, which are in contact with the stacked active layers 110, respectively. The conductive material for the bit lines 120 may include at least one selected from the group consisting of a metal layer such as tungsten (W), copper (Cu), titanium (Ti) molybdenum (Mo), and tantalum (Ta), a metal nitride layer such as titanium nitride (TIN), tantalum nitride (TaN), tungsten nitride (WN), molybdenum nitride (MoN) niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), and tantalum aluminum nitride (TaAlN), a metal silicide layer such as titanium silicide (TiSi), an heterometal layer such as titanium tungsten (TiW) and a metal oxynitride layer such as a titanium oxynitride (TiON), tungsten oxynitride (WON), and tantalum oxynitride (TaON). In addition, the bit line 120 is commonly coupled to active layers 110 arranged on the same plane. Next, an insulating layer fills the first hole H1 to form an insulating plug 125. The bit lines 120 stacked in a y-direction and disposed in the same layer in the x-direction are separated from one another by the stacked interlayer insulating layers 115 and the insulating plug 125.

Figure 5:
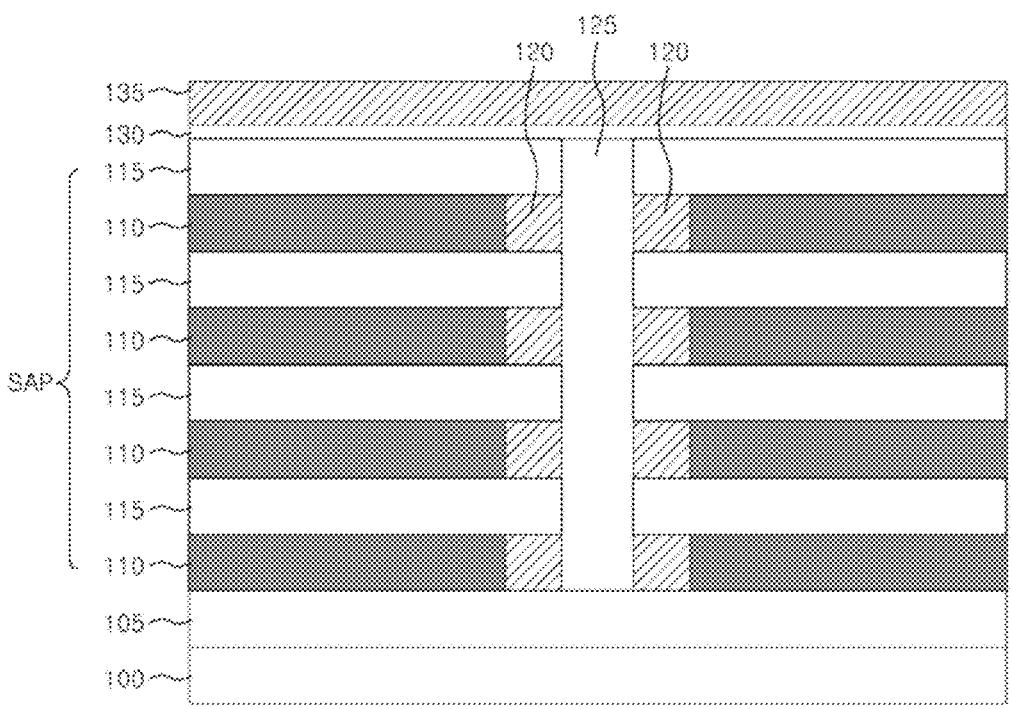
Figure 13:
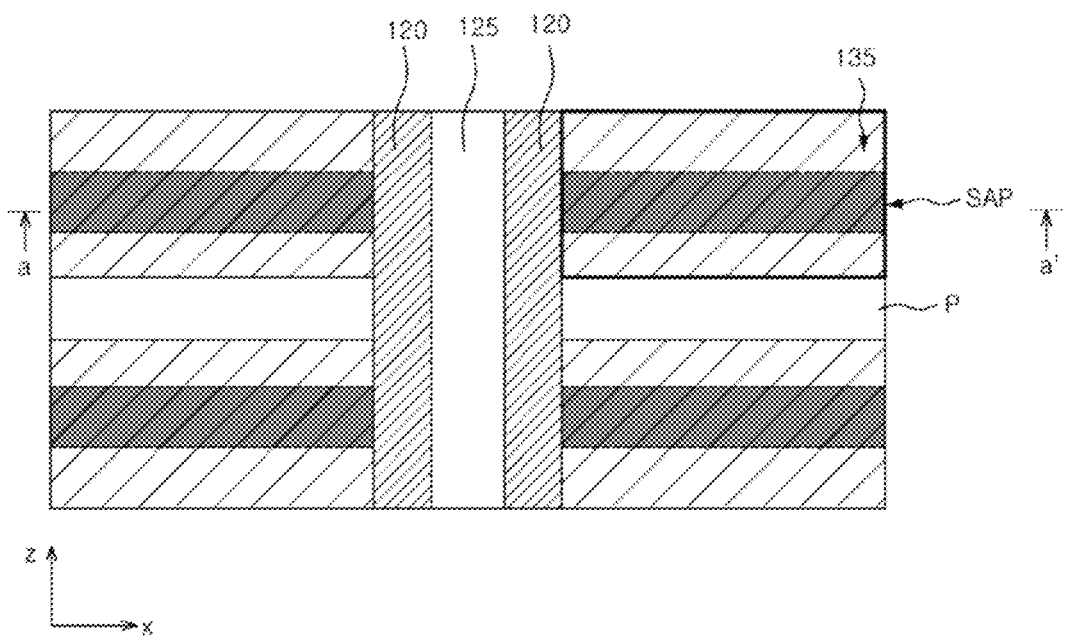

Referring to FIGS. 5 and 13, a second portion of the stacked active structure SA is etched to expose the insulating layer 105 so that the stacked active structure SA is separated in the x-direction of FIG. 13. An area P in FIG. 13 denotes an area in which the stacked active structure SA is etched to be separated in the x-direction. Through this etching process, the stacked active structure SA is divided into a plurality of stacked active patterns SAP having a rectangular shape extending in the x-direction. Here, each of the stacked active patterns may be referred to as a stacked active region, and one layer constituting the stacked active region may be a unit active region in which one memory cell is formed.

A gate insulating layer 130 and a gate electrode layer 135 are formed on a resultant structure of the semiconductor substrate 100 in which the plurality of stacked active patterns SAP are formed. Like the bit line, the gate electrode layer 135 may include any one selected from the group consisting of a metal layer such as tungsten (W), copper (Cu), titanium (Ti), molybdenum (Mo), and tantalum (Ta), a metal nitride layer such as titanium nitride (TiN), tantalum nitride (TaN), tungsten nitride (WN), molybdenum nitride (MoN), niobium nitride (NbN), titanium silicon nitride (TiSiN) titanium aluminum nitride (TiAlN) titanium boron nitride (TiBN), zirconium silicon nitride (ZrSiN) tungsten silicon nitride (WSiN), tungsten boron nitride (WBN), zirconium aluminum nitride (ZrAlN), molybdenum silicon nitride (MoSiN), molybdenum aluminum nitride (MoAlN) tantalum silicon nitride (TaSiN), and tantalum aluminum nitride (TaAlN), a metal silicide such as titanium silicide, an heterometal layer such as titanium tungsten (TiW), and a metal oxynitride layer such as a titanium oxynitride (TiON), tungsten oxynitride (WON), and tantalum oxynitride (TaON).

The gate electrode layer 135 and the gate insulating layer 130 are first patterned to surround each stacked active pattern SAP.

Figure 6:
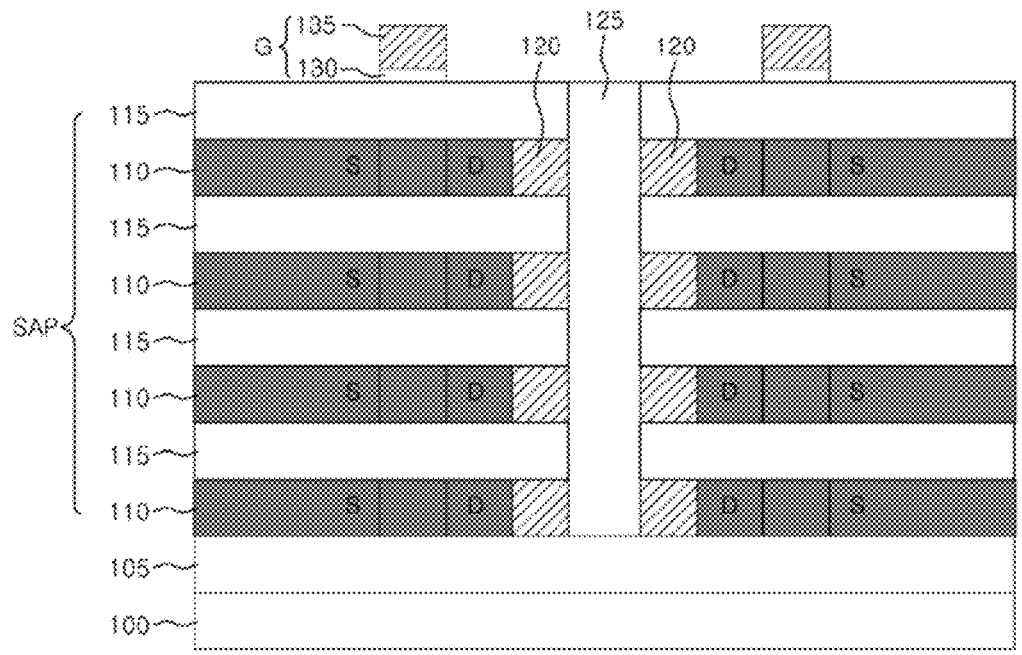
Figure 14:
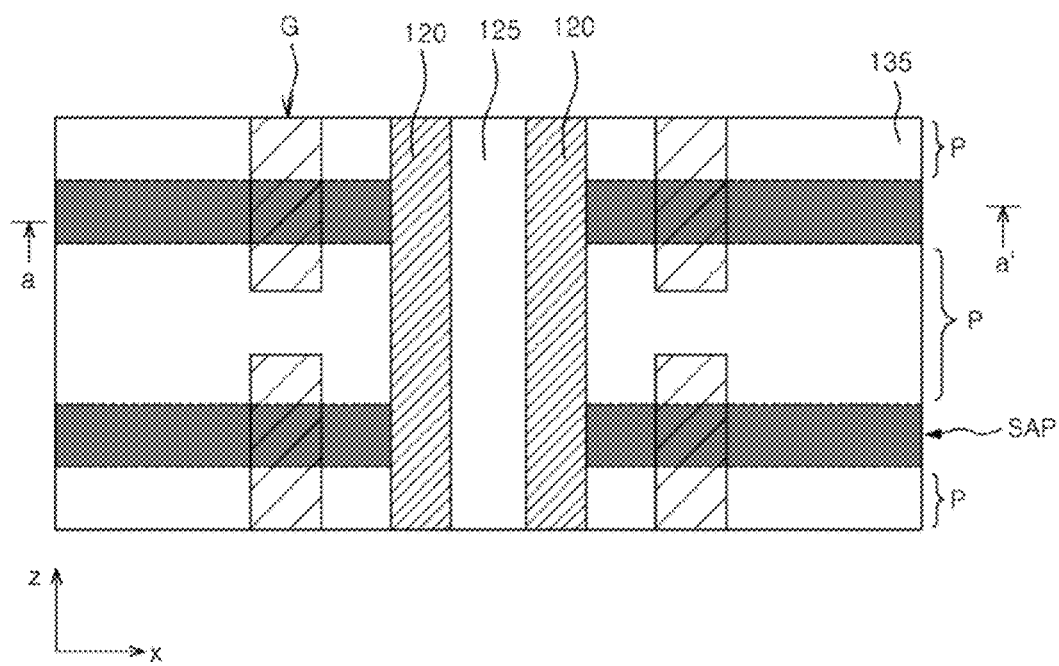

Referring to FIGS. 6 and 14, the first patterned gate electrode layer 135 and gate insulating layer 130 are additionally etched to form gate structure G on the stacked active patterns SAP, The gate structure G is formed on each of the stacked active patterns SAP. More specifically, when viewed in a plane of FIG. 14, each of the gate structures G is arranged in a direction perpendicular to the extending direction (x-direction) of each of the stacked active patterns SAP. However, the gate structure G is substantially formed to surround an upper surface and side surfaces of the stacked active pattern SAP as shown in FIG. 1. Therefore, although the gate structure G is arranged in a one-to-one correspondence with the stacked active patterns SAP, the gate structure G substantially serves as a shared gate electrode to the unit active regions constituting each of the stacked active patterns SAP.

Next, a source and a drain are formed in each of the exposed unit active regions using the gate structure G as a mask. The source S and drain D may be formed in each of the stacked unit active layers 110 through a stepwise ion implantation process. In this process the drain D may be formed to be in contact with the bit line 120. The source S may have a larger width than the drain D so that a space where a resistive device layer (not shown) is to be formed in a subsequent process is ensured.

Figure 7:
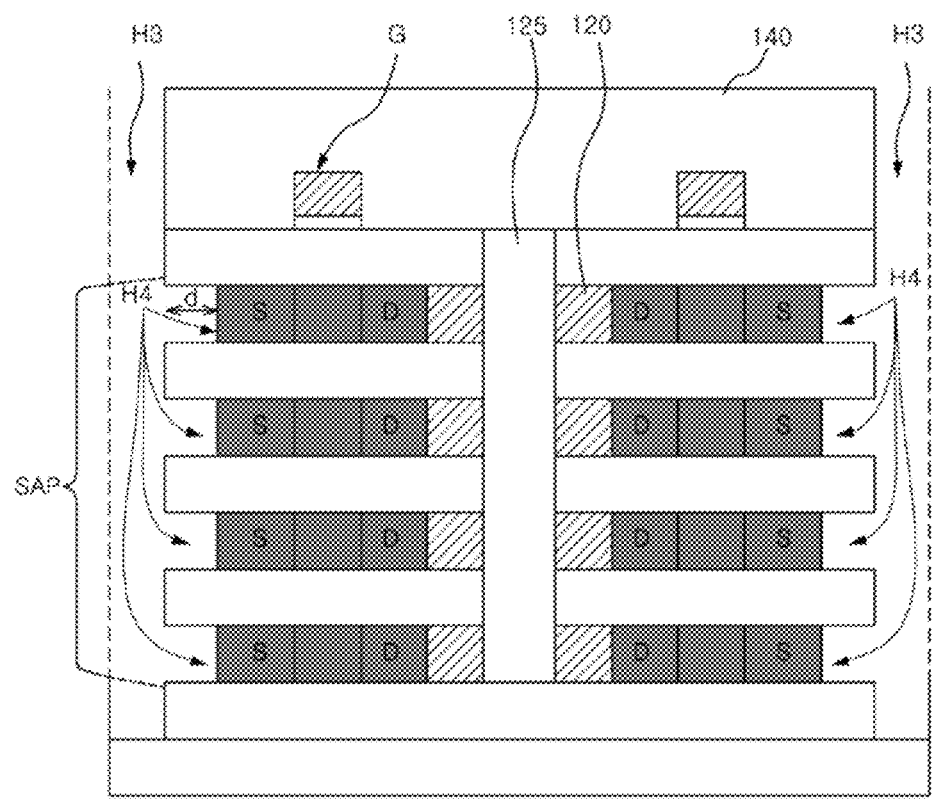
Figure 15:
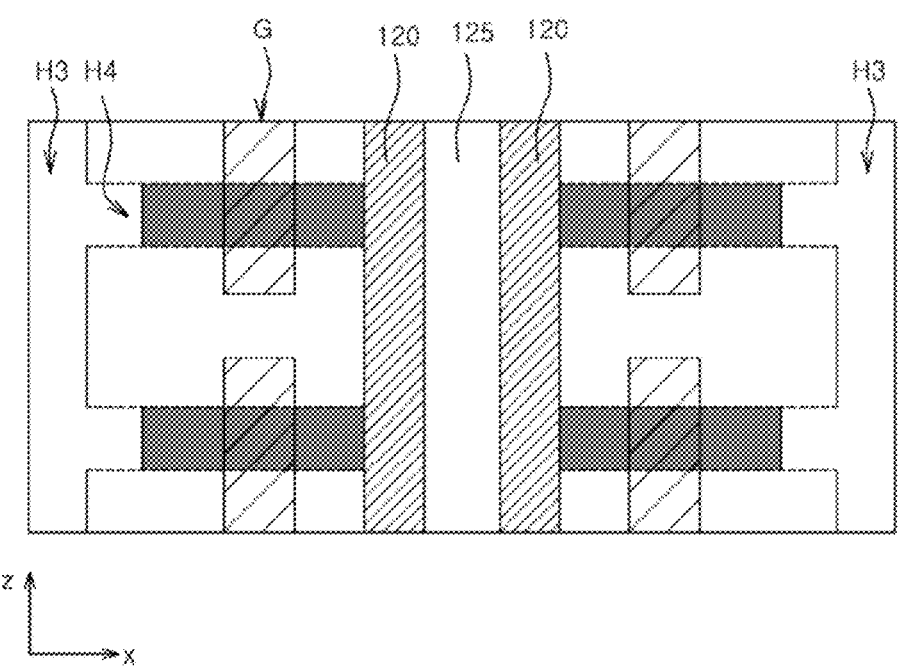

Referring to FIGS. 7 and 15, an upper insulating layer 140 is formed on a resultant structure of the semiconductor substrate 100 including the gate structure G. Next, the upper insulating layer 140 and the stacked active patterns SAP are etched to expose sidewalls of the sources S of the stacked active patterns SAP to form a third contact hole H1 Portions of the exposed source S are pulled back by a designated length to form fourth holes H4. Here, a depth of the fourth hole H4 is determined to be substantially equal to a width of the drain D.

Figure 16:
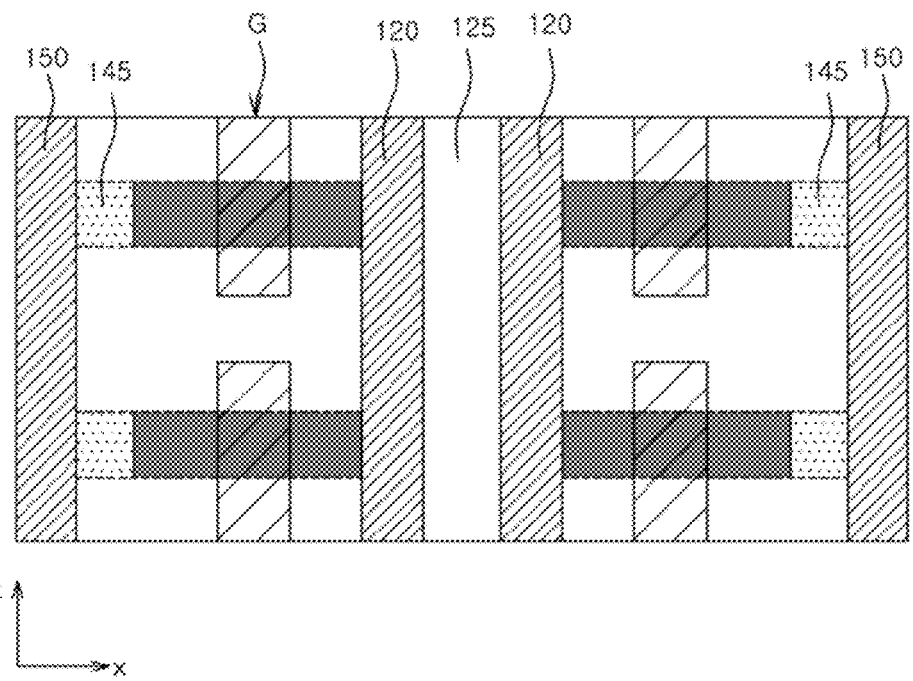

Referring to FIGS. 8 and 16, a resistive material fills the fourth holes H4 to form a resistive device layers 145. The resistive device layer 145 may include any one selected from the group consisting of a praseodymium calcium manganese oxide (PCMO) layer, which is a material for a resistive random access memory (ReRAM), a chalcogenide layer, which is a material for a phase-change random access memory (PCRAM), a magnetic layer, which is a material for a magnetic random access memory (MRAM), a magnetization switching device layer, which is a material for a spin-transfer torque MRAM (STTMRAM), and a polymer layer, which is a material for a polymer random access memory (PoRAM). By forming the resistive device layer 145, a transistor coupled to the resistive device layer 145 is formed.

A conductive material fills the third hole H3 to form a common source line 150 that is commonly coupled to the resistive device layers 145 coupled to the respective sources S.

Figure 17:
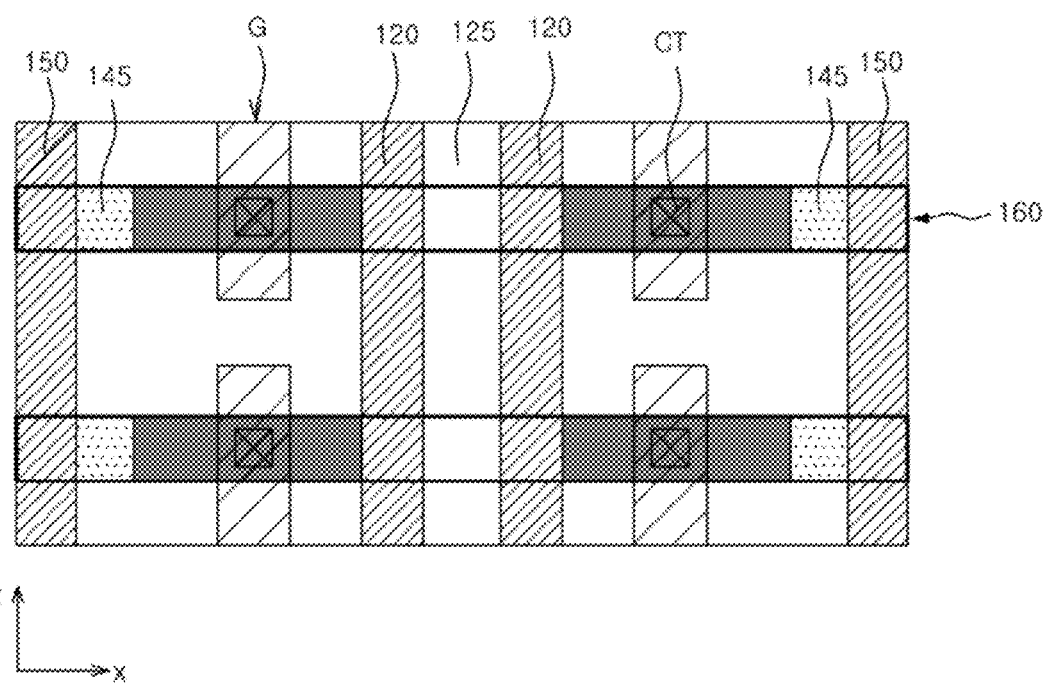

Referring to FIGS. 9 and 17, an interlayer insulating layer 155 is formed on a resultant structure of the semiconductor substrate 100 including the common source line 150, and subsequently, a conductive plug 157, which is in contact with the gate structure G, is formed within the interlayer insulating layer 155. A word line 160 is formed on the interlayer insulating layer 155 to be in contact with the conductive plug 157. The word line 160 may extend in the same direction as an extending direction of the active layer 110. A contact CT shown in FIG. 17 is a contact between the word line 160 and the conductive plug 157.

Figure 18:
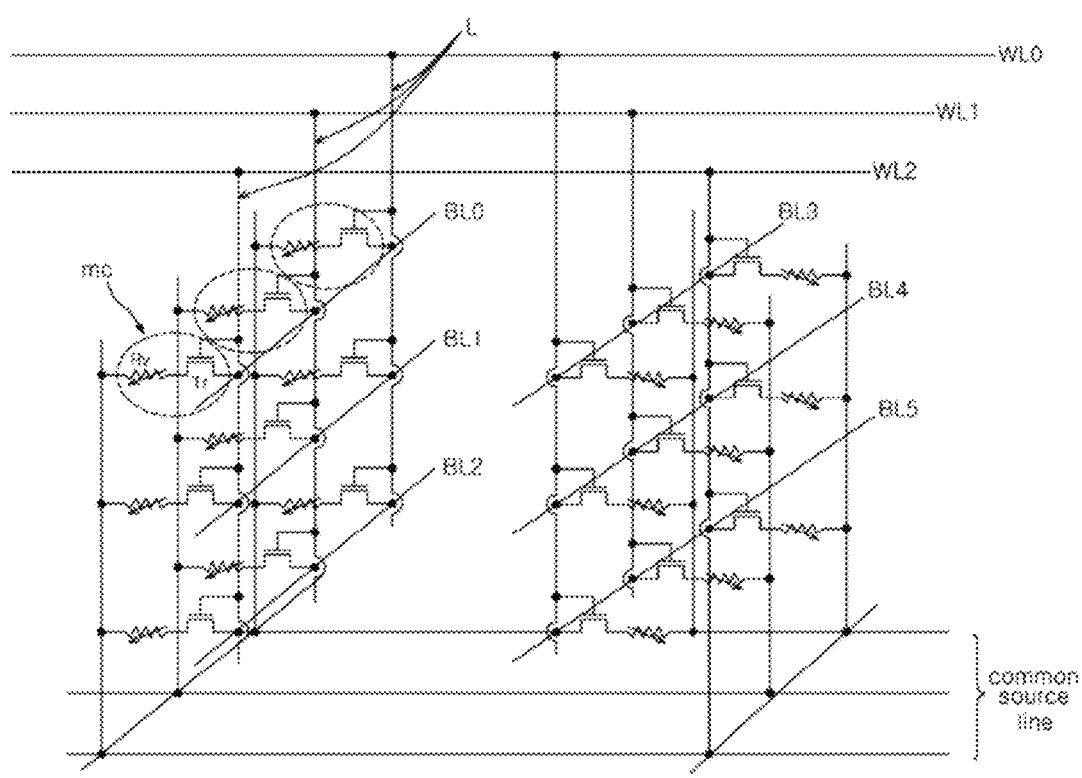
FIG. 18 is a circuit diagram of a stack type memory device according to an exemplary embodiment of the present invention.

The stack type memory device according to the above-described exemplary embodiment may be implemented with a circuit shown in FIG. 18.

Referring to FIG. 18, a stack type memory device 1000 includes a plurality of word lines WL0, WL1, and WL2, a plurality of bit lines BL0, BL1, and BL2, and a plurality of memory cells mc.

The plurality of bit lines BL0, BL1, and BL2 are stacked and extend in a first direction. The plurality of word lines WL0, WL1, and WL2 include interconnection units L extending toward the stacked bit lines BL0, BL1 and BL2, Here, the interconnection units L may correspond to the contact plugs 157 of FIG. 9.

The plurality of memory cells mc are coupled between the interconnection units L extending from the plurality of word lines WL0, WL1 and WL2 and the bit lines BL0, BL1 and BL2. Each of the plurality of memory cells mc may be constituted of a transistor Tr and a variable resistor R. In the transistor Tr, a gate is coupled to a corresponding interconnection unit L, a drain is coupled to a corresponding bit line, and a source is coupled to the variable resistor Rv. The variable resistor Rv may be coupled to the common source line 150 and correspond to the resistive device layer 145 of the exemplary embodiment.

Bit lines BL3, BL4, and BL are bit lines arranged in adjacent stacked active regions.

The stack type memory device is configured to stack the plurality of memory cells and stack the bit lines to improve an integration density. Accordingly, a word line formation area is ensured and the word line may be prevented from being bounced.

Figure 19:
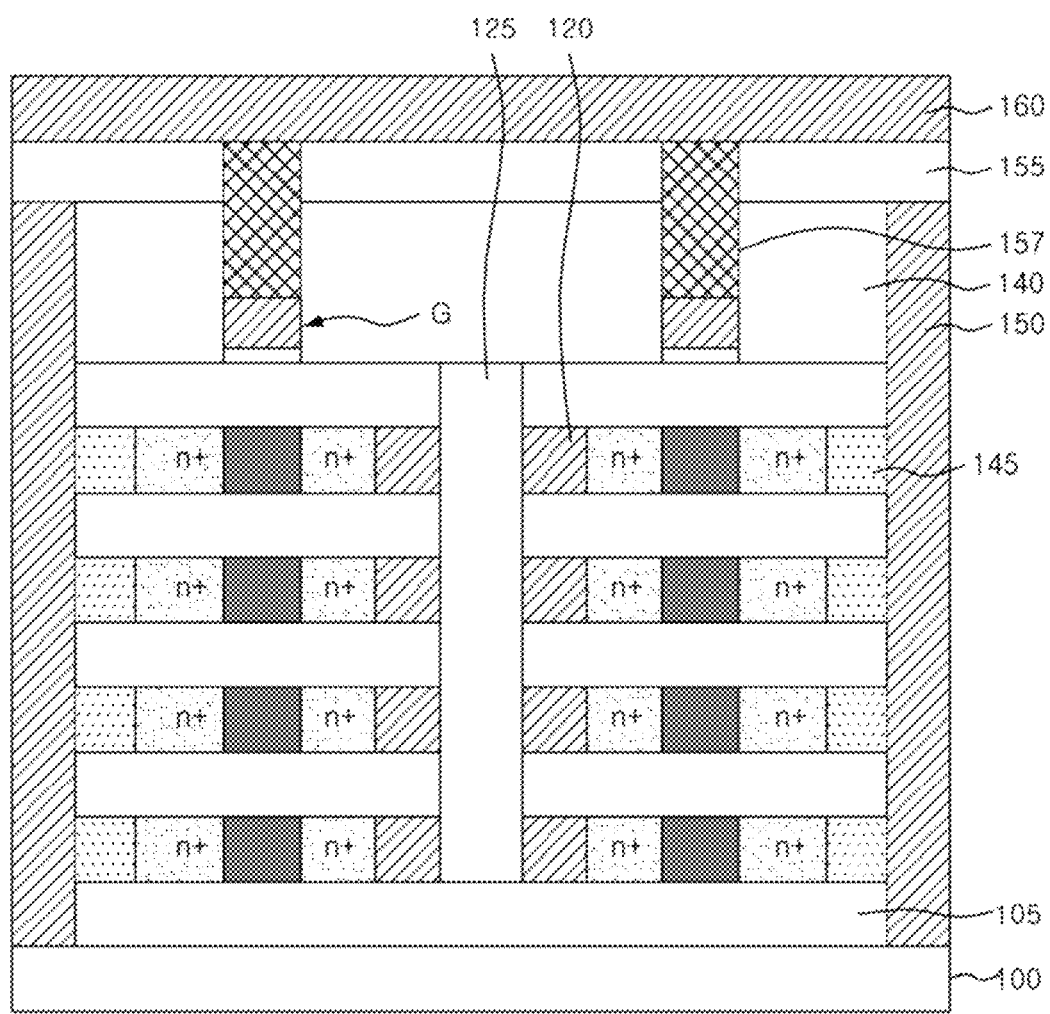
FIGS. 19 to 21 are cross-sectional views illustrating stack type memory devices according to other exemplary embodiments of the present invention.

FIG. 19 is a cross-sectional view illustrating a stack type resistive memory device according to another exemplary embodiment. In the exemplary embodiment, an NMOS transistor is used as a transistor. A source and a drain of the NMOS transistor may be formed by implanting a high concentration n type impurity.

Figure 20:
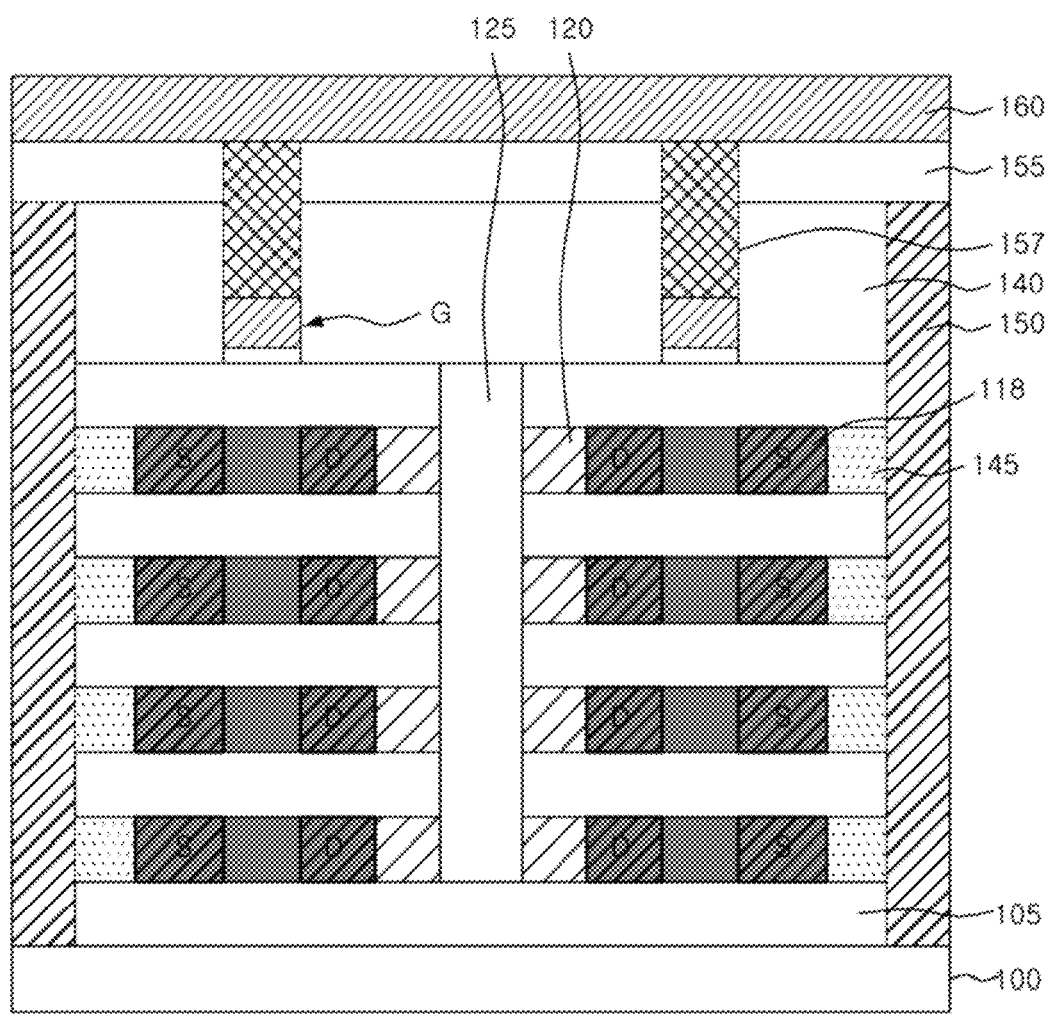

In addition, as shown in FIG. 20, silicide layers 118 may be used as a source and a drain of a transistor. By using silicide layers, a junction resistance of the transistor can be improved.

Figure 21:
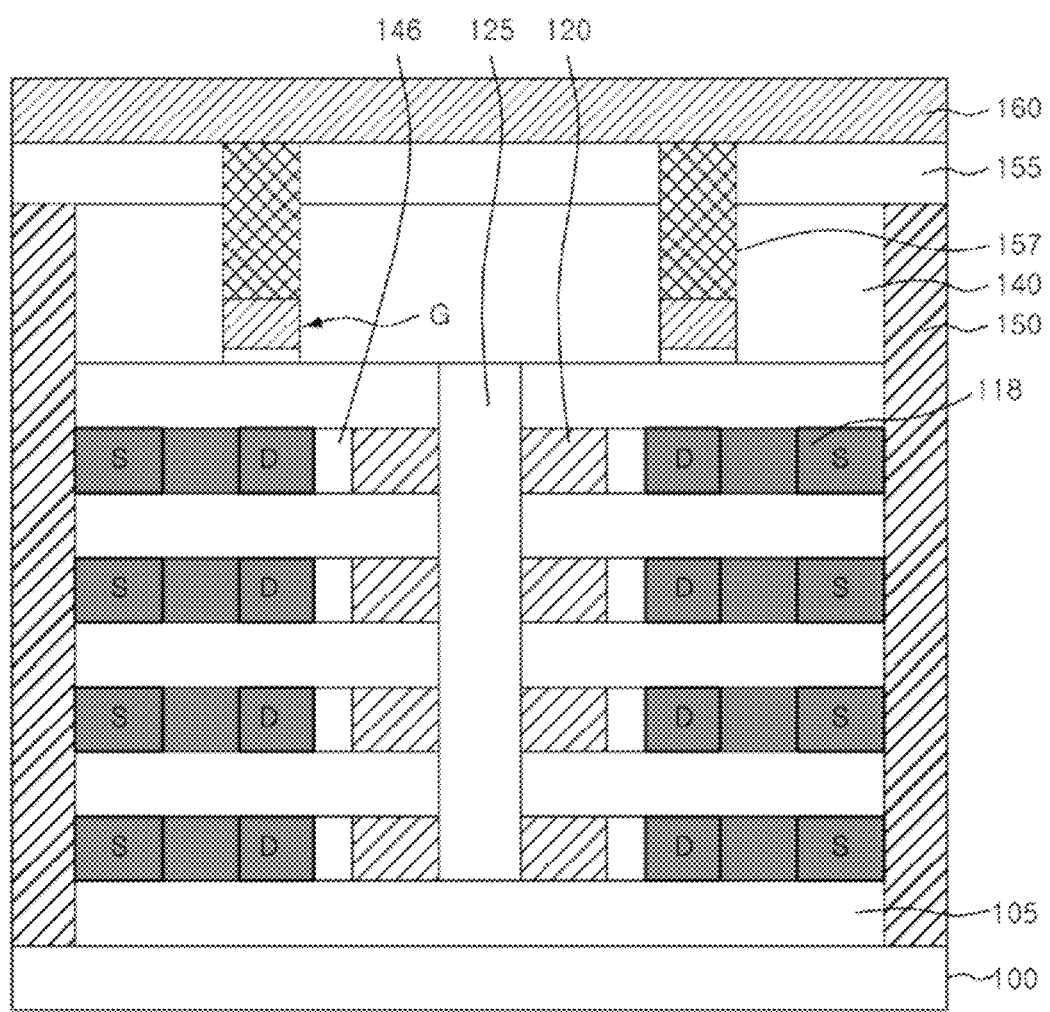

In addition, as shown in FIG. 21, a resistive device layer 146 may be disposed between a drain D and a bit line 120. Through this embodiment, the same features as in the above-described exemplary embodiments can be obtained.

Although not described in detail in the above-described exemplary embodiments, a source and a drain of a transistor may be formed in a general lightly doped drain (LDD) type.

As described above in detail, according to the exemplary embodiments, the resistive memory device is configured in a three dimensional structure, and thus, an integration density may be improved and a word line bouncing can be prevented.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A stack type memory device, comprising: a semiconductor substrate;
   a plurality of active layers stacked on the semiconductor substrate; a gate overlapping the plurality of active layers; and
   a gate insulating layer formed between the gate and the plurality of active layers, wherein the gate includes side gates overlapping front sides and back sides of the plurality of active layers and a top gate overlapping a top of an uppermost active layer and connecting with the side gates, and the side gates and the top gate are physically connected,
   wherein each active layer includes a drain, a source and a channel region between the drain and the source, and the side gates overlap with the channel regions of the active layer, respectively, a channel is generated in the channel region, when a gate voltage is applied to the gate, and
   wherein a direction of the channel is parallel with a surface of the semiconductor substrate,
   further comprising bit lines positioned at outer sides of the drains, respectively,
   wherein each bit line forms a stripe pattern and extends to perpendicular to an extending direction of the active layers in a plan view,
   further comprising variable resistive layers positioned at outer sides of the sources, respectively, and
   further comprising a common source line which the variable resistive layers are commonly coupled thereto,
   wherein the common source line extends to be parallel with to an extending direction of the bit lines in the plan view.

2. The stack type memory device of claim 1, wherein the plurality of active layers are formed in a stripe pattern, and the side gates extend to a direction substantially perpendicular to an extending direction of the stripe pattern.

3. The stack type memory device of claim 1, further comprising an interlayer insulating layer which is interposed between the plurality of active layers and insulates the plurality of active layers from each other.

4. The stack type memory device of claim 1, wherein the gate structure has an inverse U-shape.

5. The stack type memory device of claim 1, further comprising an interlayer insulating layer which is interposed between the plurality of active layers and insulates the plurality of active layers from each other,
   wherein the interlayer insulating layer is interposed between the bit lines which are stacked, and between the variable resistive layers which are stacked, respectively.

* * * * *